United States Patent [19]

Kulicke, Jr. et al.

[11] Patent Number: 4,763,826
[45] Date of Patent: Aug. 16, 1988

[54] AUTOMATIC WIRE FEED SYSTEM

[75] Inventors: Frederick W. Kulicke, Jr., Horsham; David A. Leonhardt, Norristown; Robert B. Newsome, Hatfield; Richard D. Sadler, Quakertown; Gary S. Gillotti, Telford, all of Pa.

[73] Assignee: Kulicke and Soffa Ind., Inc., Willow Grove, Pa.

[21] Appl. No.: 862,988

[22] Filed: May 14, 1986

[51] Int. Cl.⁴ .............................................. B23K 37/00
[52] U.S. Cl. ................................. 228/4.5; 242/147 A; 226/45
[58] Field of Search ............................. 228/4.5, 10, 9; 226/100, 11, 45; 242/147 A, 75, 183

[56] References Cited

U.S. PATENT DOCUMENTS

| | | | |
|---|---|---|---|
| 3,018,975 | 1/1962 | Kulicke | 242/75 |
| 3,672,588 | 6/1972 | Bense | 242/147 A |
| 3,944,166 | 3/1976 | Hermanns | 242/147 A |
| 4,019,669 | 4/1977 | Tanimoto et al. | 228/4.5 |
| 4,498,638 | 2/1985 | Kurtz et al. | 226/45 |

FOREIGN PATENT DOCUMENTS

| | | | |
|---|---|---|---|
| 0111808 | 9/1979 | Japan | 242/183 |
| 0021134 | 2/1980 | Japan | 228/4.5 |
| 0072049 | 5/1980 | Japan | 228/4.5 |

Primary Examiner—Nicholas P. Godici
Assistant Examiner—Karen Skillman
Attorney, Agent, or Firm—John B. Sowell

[57] ABSTRACT

An improved automatic wire feed system for supplying a fine wire to a capillary bonding tool or to a wedge bonding tool is provided. The wire feed system includes a novel wire feed slack loop device which is mounted on the wire bonder between the bonding tool and the source of fine wire. The novel wire feed slack loop device comprises a pair of sector plates which are closely spaced apart from each other to provide an air space therebetween for receiving the fine wire. Compressed air is supplied to the air space between the sector plates and is directed radially outward by a diffuser shim plate which forces the wire to form into a uniform circular shape in the air space. Sensor means are provided at the outer perimeter of the sector plates which sense the position of the fine wire and supplies a signal to control means which turns off the rotation of the drive motor. Turning off the gas provides a slack wire loop with sufficient fine wire to make an interconnection on a semiconductor device without creating tension or compression of the wire at the bonding tool.

17 Claims, 4 Drawing Sheets

AUTOMATIC WIRE FEED SYSTEM

BACKGROUND OF THE INVENTION

1. Field of the Invention

The present invention relates to an improved wire feed mechanism and more particularly to an improved automatic wire feed system for automatic fine wire bonders.

2. Description of the Prior Art

Automatic wire bonders are classified in Class 228, subclasses 1 to 4.5. Wire feed mechanisms for fine wires used by such wire bonders are classified in Class H 01 L subclasses 21/60 and 23/48.

Manual wire bonder manufacturers recognized the problems associated with wire feeds and were successful in providing fine wire from a large spool by enclosing the wire and wire spool in a closed chamber and feeding the wire through a capillary tube with air pressure as shown in U.S. Pat. No. 3,018,975 issued to Kulicke and Soffa Industries, Inc. Such prior art continuous wire feed mechanism were not provided with means for detecting when a wire bond had not been made or when a break had occurred in the fine wire at the bonding tool.

Fine wire for wire bonding is die drawn to size and rolled onto spools. As the fine wire is unwound from the spool, it often has a spring action or a kink which can pull the fine wire out of the wire guide of a bonding tool when the wire clamps are open or can cause too much wire to be fed through the wire guide of the bonding tool. The amount or size of the wire tail at first bond affects the size of the ball or tail being bonded. The pull or push on the wire also affects the size of the wire loop interconnecting the first and second bond. After the second bond is made and the fine wire is broken, any retraction of the fine wire from the wire guide of the bonding tool can result in a lost wire.

Heretofore, fine wires have been automaticallY capstan fed from a spool to maintain a constant wire slack or loop between the spool and the wire bonding tool as shown in Japanese patent application publication P58-116742. Such wire feed mechanisms are provided with tensioning devices and pinch capstans to control the amount of wire in the loop.

Heretofore, fine wire detectors employed an air blast on a portion of a fine wire to impart either a force or a tension on the wire between the wire spool and the wire bonding tool. Such back tensioning devices are shown in Japanese application publications 57-17141 and 59-115533. Both of these prior art structures maintained a pull or tension on the wire during the bonding cycle which could cause the wire to be pulled from the bonding tool if the wire clamp are open.

If the first bond does not stick or bond properly and the wire clamps are opened when the bonding tool is moved to a second bond position, the pull or tension on the wire at the bonding tool can cause the fine wire to be pulled out of the wire guide. When this condition occurs with an automatic wire bonder, additional maintenance time is required to rethread the fine wire through the wire feed systems.

It is desirable to provide an automatic fine wire feed system which has none of the disadvantages of the prior art systems and places neither tension nor compression in the fine wire leading to the bonding tool and eliminates the effects of spring tension, twisting and kinking.

SUMMARY OF THE INVENTION

It is the principal object of the present invention to provide an improved fine wire feed system.

It is another principal object of the present invention to provide a novel fine wire feed system which forms a tension free service loop in the fine wire between the wire spool and the bonding tool.

It is a another object of the present invention to provide a novel fine wire feed system which minimizes drag on the fine wire and ensures that the fine wire does not get pulled out of the bonding tool when the wire clamps are open.

It is yet another object of the present invention to provide a novel structure for producing a kink and spring free wire feed slack loop.

It is yet another object of the present invention to provide an improved method of feeding a fine wire to a wire bonding tool.

In accordance with these and other objects of the present invention, to be explained in detail hereinafter, there is provided an automatic wire feed system comprising a wire feed drive motor activated by control means to pay out fine wire to a wire feed slack loop apparatus. Said wire feed slack apparatus comprising a pair of closely spaced sector plates for receiving said fine wire and having a source of gas pressure applied therebetween to force said fine wire radially outward between said sector plates until said fine wire contacts a sensor pin, and control means for stopping said wire feed drive motor.

DESCRIPTION OF THE PREFERRED EMBODIMENT

Figure 1:
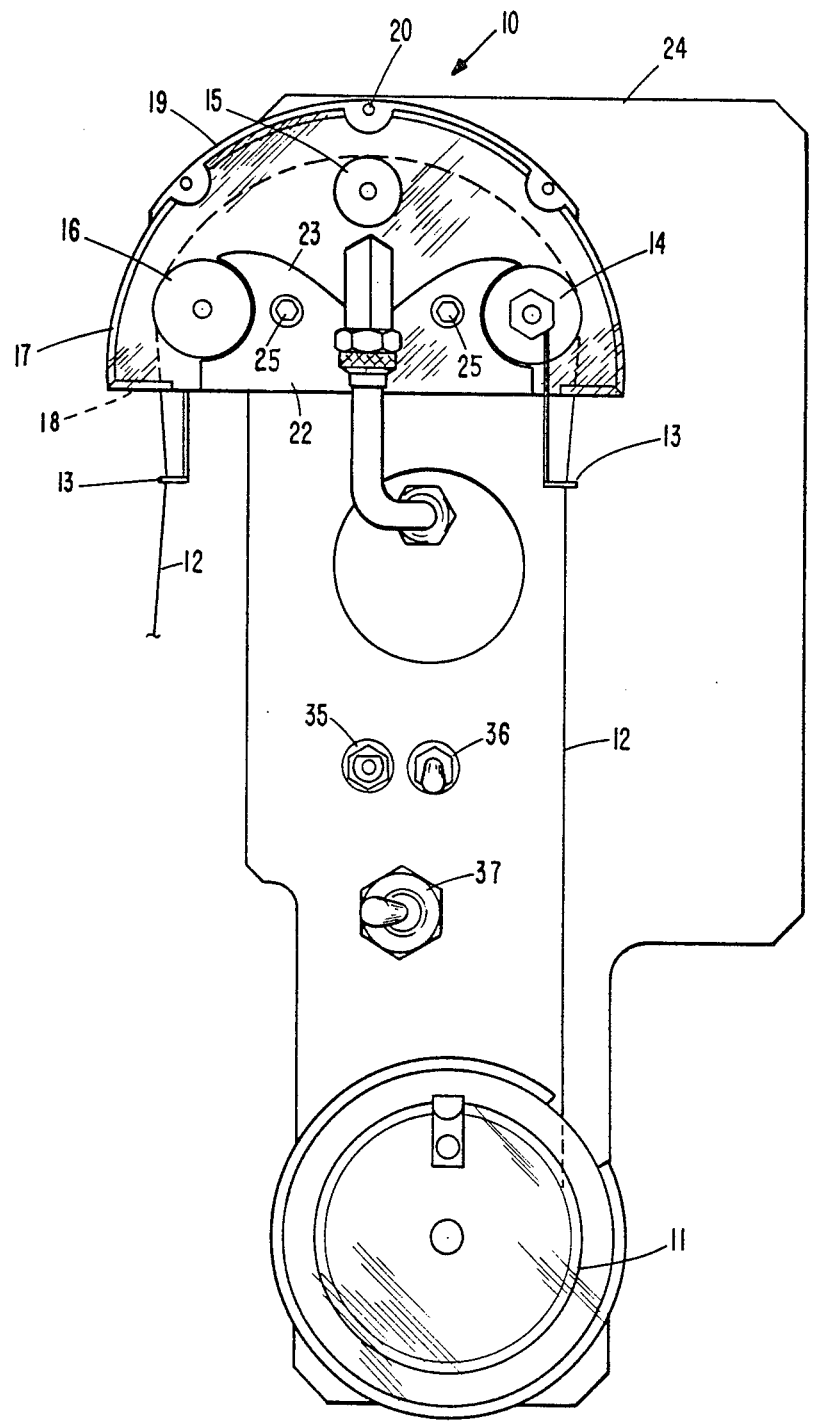
FIG. 1 is a front view in elevation showing a preferred embodiment automatic wire feed apparatus.
Figure 2:
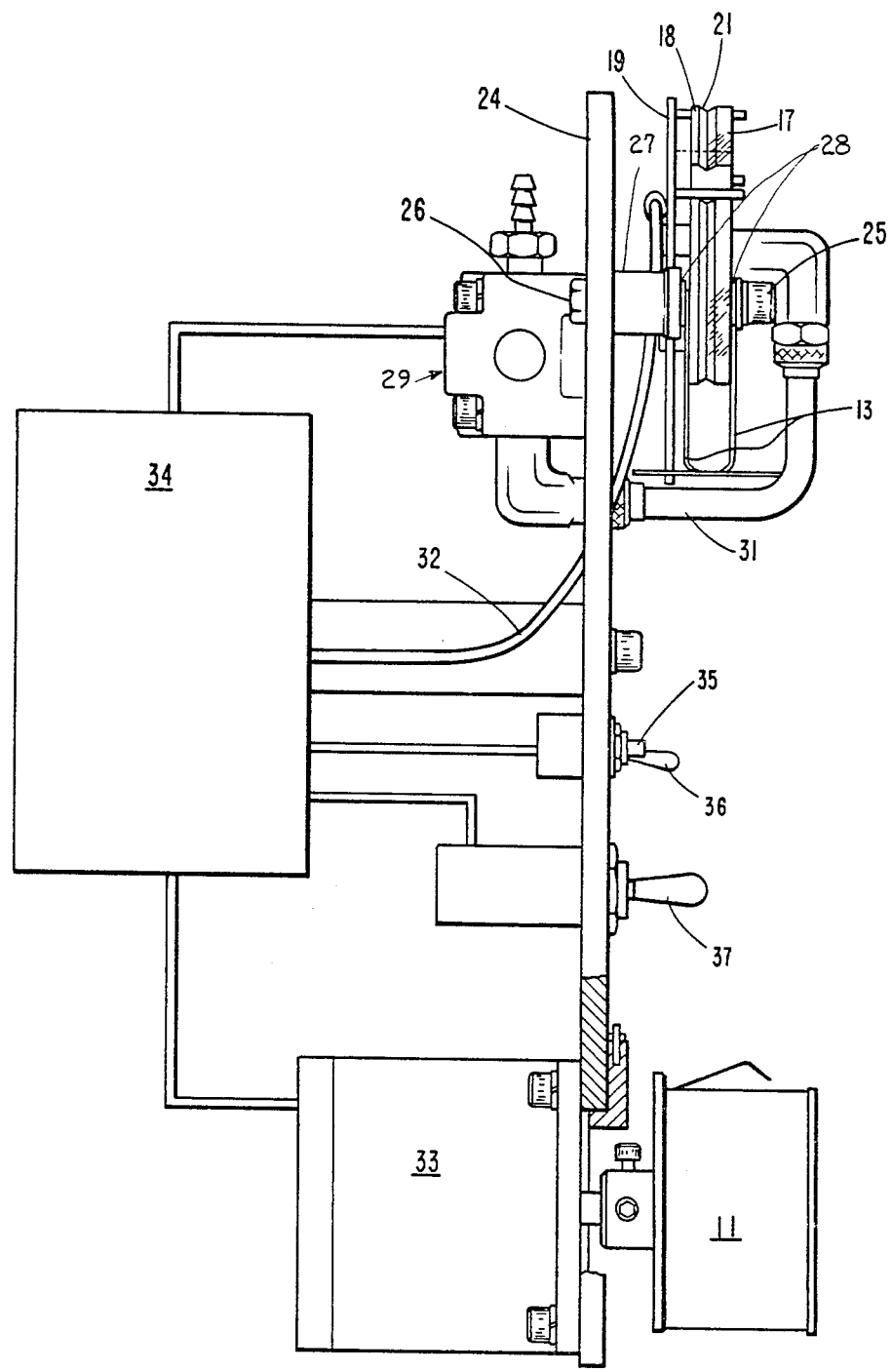
FIG. 2 is a side view in elevation of the wire feed mechanism of FIG. 1.

Refer now to FIGS. 1 and 2 showing a front view and a side view in elevation of the slack loop device 10 of the automatic wire feed mechanism. A spool of fine wire 11 is adapted to provide a fine wire 12 which is threaded into the slack loop device 10. The fine wire 12 is directed by a wire guide 13 onto stationery guides 14, 15 and 16 which maintain the fine wire 12 in a cicumferential arch between the two sector plates 17 and 18 to be described in detail hereinafter. Preferably the sector plates 17 and 18 are made from transparent material such as transparent plastic so that the wire 12 may be observed in the slack loop device 10. Preferably, guides 14 to 16 are dowels or cylinders which fit tightly in apertures in the sector plates 17 and 18. A sensor pin plate 19 is pivotally mounted on the sector plates 17 and 18 and is provided with sensor pins 20 which will be described in greater detail. The sensor pins 20 are shown positioned at the top of the V groove 21 formed by the chamfer on sector plates 17 and 18. Sector plates 17 and 18 are closely spaced apart by a shim 22 which has diffuser portion 23. The sector plates are mounted on the wire feed mounting plate 24 by bolts 25 tapped into mounting plate 24 and preferably provided with cap nuts 26. Spacers 27 are provided with load distributing washers 28 which distribute the load on the plastic sector plates.

In the preferred embodiment, a solenoid operated air valve 29 is connected to a supply tube 31 which supplies air through the outer sector plate 17 into the air space between the sector plates at the diffuser portion 23 of shim 22. Two operational modes are available with the preferred embodiment slack loop device 10. When the air valve 29 remains continuously on, the fine wire is circumferentially formed by the air in the space between sector plates which is directed radially outward. The wire proceeds to be formed with a continuous radial curvature and as more wire is supplied by spool 11, the wire moves radially outward until it contacts the sensor pins 20 on sensor pin plate 19. An electrical wire is connected to the sensor pins in a manner which detects the contact of wire 12 with pins 20. The electrical signal sensed on electrical wire 32 is employed to stop the rotation of the wire feed drive motor 33. In the preferred mode of operation, the detected signal on wire 32 is not employed to shut off solenoid operated air valve 29 so the pull or back tension on wire 12 is maintained until the bonding operation starts.

Control means 34 is shown diagrammatically connected to the electrical sensor wire 32, drive motor 33, and solenoid operated air valve 29. Also shown connected to control means 34 are a manual feed switch 35, an auto feed switch 36 and an operating mode switch 37. These switches are self-explanatory and do not require further explanation for the operation of the control means 34 is not considered to be the invention claimed. The preferred embodiment sensor pin plate 19 may be made from a dialectric material which supports two or more conductive sensor pins 20. When the wire is fed from spool 11 and forced by the air between the sector plates, the wire 12 will eventually contact one or more of the sensor pins 20. Accordingly, the sensor pins may be wired so that a voltage source is supplied on one of the pins and the contact of the wire 12 with the voltage source pin and one of the sensor pins will detect that the wire is at the outer perimeter of the sector plates. It will be understood that the sensor pins are only one of several possible ways of detecting the position of the wire at the outer perimeter of the sector plates. The wire 12 may be grounded to prevent current from being passed to the semiconductor device being bonded. In this embodiment, the voltage supply on the pins will detect the grounding of the sensor pins. Another method of detecting the wire at the outer perimeter of the sensor plates is to provide thereon miniature light or photosensor which detects the upper and lower limit of the wire. Such detectors are commercially available. The conductive sensor pins may be replaeced with a conductive perforated grill which senses when the wire 12 touches the grill. It will be noted that when the wire is at the upper limit of the V groove before it touches a sensor pin 12 that the air space is becoming wider and diverging in the V groove 21 so that there is little or no tension imparted to the wire 12 in its preferred position for the next bond.

Figure 3:
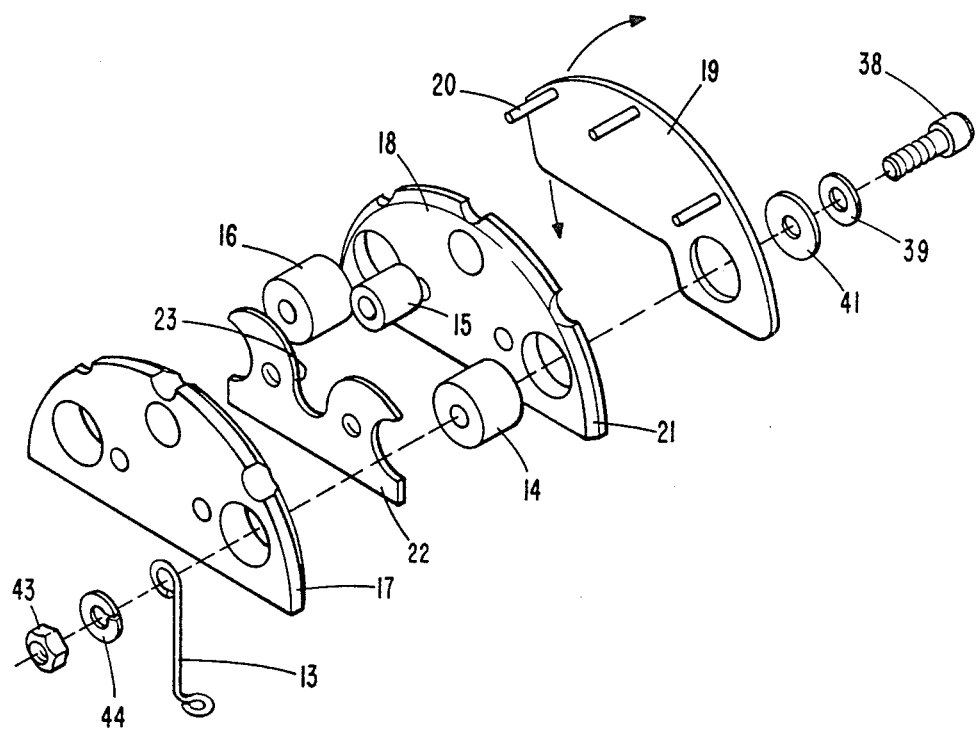
FIG. 3 is an enlarged exploded view of the preferred embodiment structure for producing a wire feed slack loop.
Figure 4:
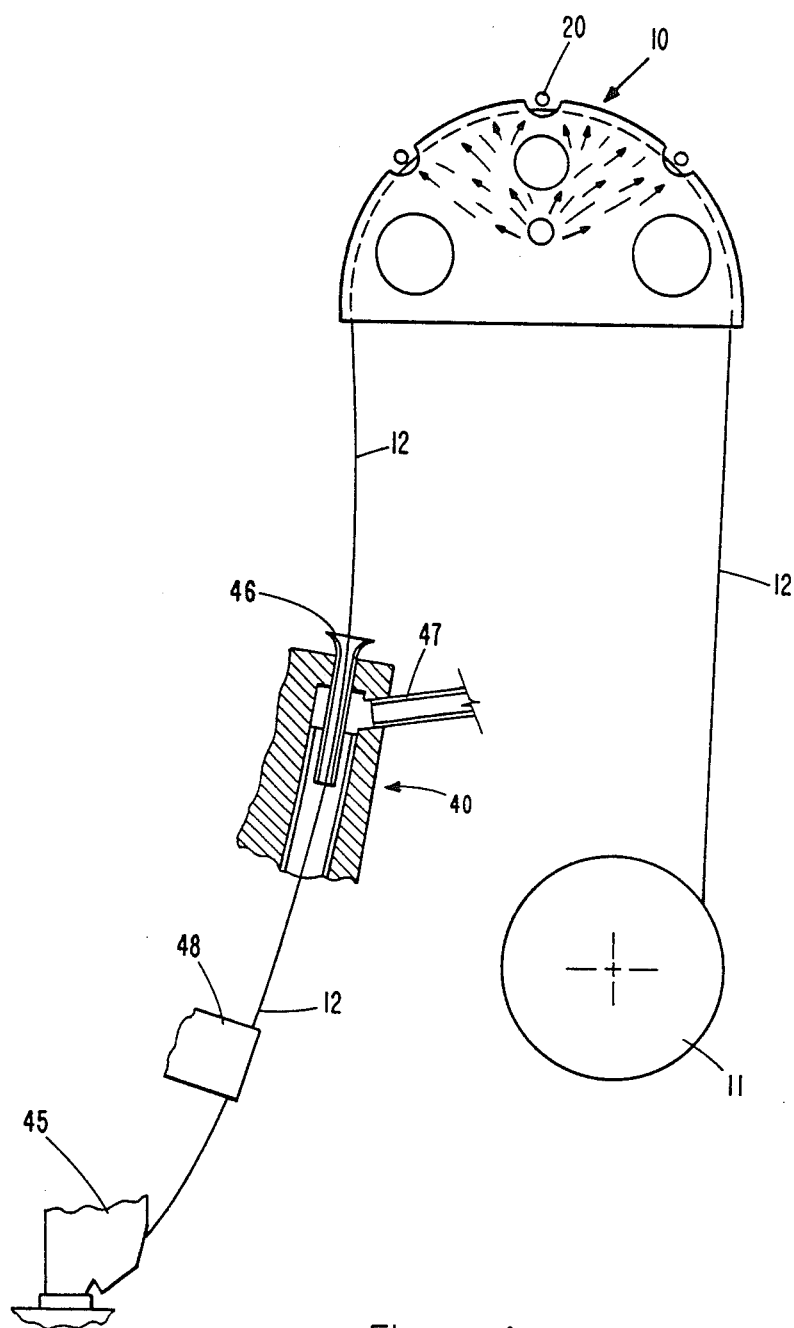
FIG. 4 is a schematic drawing showing the preferred embodiment automatic wire feed apparatus feeding a fine wire to a bonding wedge.

Refer now to FIG. 3, showing an enlarged exploded view of the preferred embodiment slack look device for producing a uniform radius slack loop in the sector plates. Outer transparent sector plate 17 and inner transparent sector plate 18 are shown separated by a diffuser shim 22. The sensor pin plate 19 may be made from an electrically conductive metal or from an insulating plastic depending on the manner in which the sensor pins 20 are connected for a preferred mode of operation. Sensor pin plate 19 is shown pivoted on cap screw 38 which extends through sensor pin plate 19 and is separated from inner sector plate 18 by a dielectric washer 39 and bushing 41. The cylindrical guides or dowels 14 to 16 are employed for aligning the sector plates 17 and 18 with the spacer or shim 22. There is provided a nut fastener 43 and lock washer 44 to support the wire guide 13.

Refer now to a schematic drawing showing a preferred embodiment automatic wire feed aparatus feeding a fine 12 wire to a bonding wedge 45 of an automatic wire bonder (not shown). Spool 11 supplies the wire 12 to the slack loop device 10 in a manner described hereinbefore. The slack wire loop is manually fed through the device 10 by pivoting the sensor plate 19 and pins 20 out of the grooves of the sector plates 17 and 18. To manually feed the wire 12, the system is greatly simplified by providing feed tubes which direct the fine wire 12 to the guide hole in the rear of a bonding tool 45. Feed tube 46 is employed to manually thread wire 12 into a venturi effect device which is supplied with compressed air at tube 47 under control of the aforementioned manual feed switch 25. It will be understood that once the fine wire 12 is fed through the feed tube 46 that the manual feed switch shuts off the air supply so that no pull is applied to the wire 12 and air is again supplied to plates 17 and 18. A pair of articulating wire clamps 48 of the type commonly used with automatic wedge wire bonders are shown in the wire path between the threading mechanism 40 and the wedge bonding tool 45. After the fine wire 12 is threaded through the wedge bonding tool 45, a series of test bonds may be made to stabilize the wire 12. The drive motor 33 may be rotated by using the run/thread operating mode switch 37 until the wire loop is almost formed. After performing a test bond, the drive motor will automatically supply fine wire 12 to the slack loop device 10 until the slack loop is formed.

As explained hereinbefore, the air supply to the space between the sector plates 17 and 18 is preferably shut off during a bonding operation. However, if the sensor pins 20 are properly located in the top of the V groove 21, the air is so defused that it does not apply adverse tension or pull on the is desired that there is no pull nor push on the bonding wire 12 at the bonding wedge 45. When this desirable condition occurs, if the first bond does not stick and the wire clamps 48 are open, any movement of the wedge 45 to form a loop does not force the wire out of the wire guide of the bonding tool 45 and the automatic wire bonder may be restarted without the waste of maintenance time required to rethread the wire 12 through the machine.

Use of compressed air in the space between the sector plates to support the loop of fine wire 12 avoids tramma to the wire characteristic caused by friction snubbers and other of the memory left in the wire. Another feature of the novel slack loop device is that the clean air which supports the wire 12 does not introduce contamination to the wires which will be sensed at the bonding wedge as occurs with snubbing devices and tensioning devices used in the prior art.

What we claim is:

1. An automatic wire feed system for supplying fine wire to a bonding tool of a wire bonder, comprising:

a wire feed drive motor coupled to a source of fine wire for supplying fine wire to said bonding tool when said drive motor is activated, wire feed slack loop means mounted on said wire bonder between said bonding tool and said source of fine wire, said wire feed slack loop means comprising a pair of sector plates closely spaced apart from each other to provide a narrow air space therebetween for receiving said fine wire and for forming a substantially uniform radius sector shaped slack loop in said fine wire, gas supply means connected to said air space between said sector plates, a separator shim between said pair of sector plates for directing said gas radially outward, sensor means mounted on said wire feed slack loop means and extending across said air space between said sector plates, and control means coupled to said gas supply means and to said wire feed drive motor for activating said wire feed drive motor to supply said fine wire to said wire feed slack loop means and for stopping said wire feed drive motor when said fine wire engages said sensor means.

2. An automatic wire feed system as set forth in claim 1 wherein said sensor means comprises a plurality of electrically conductive pins mounted on a movable plate.

3. An automatic wire feed system as set forth in claim 2 wherein said movable plate is provided with electrically conductive pins that are electrically connected to said control means.

4. As automatic wire feed system as set forth in claim 1 wherein said sensor means comprises a conductive screen mounted on said wire feed slack loop means.

5. An automatic wire feed system as set forth in claim 1 wherein said sensor means comprises a plurality of miniature light sources positioned opposite a like plurality of light sensors for sensing the position of said fine wire in said air space.

6. An automatic wire feed system as set forth in claim 1 wherein said separator shim is provided with an air baffle portion for directing gas from said gas supply means radially outward between said sector plates and for forming said fine wire in said substantially uniform radius sector shape.

7. An automatic wire feed system as set forth in claim 1 wherein said wire feed slack loop means further comprises a plurality of stationary guides mounted in said air space between said sector plates for guiding and forming said fine wire in said air space.

8. An automatic wire feed system as set forth in claim 7 which further includes a wire guide extending from said wire feed slack loop means for guiding said fine wire into said air. space.

9. An automatic wire feed system as set forth in claim 1 wherein said gas supply means further includes a gas control valve controlled by said control means.

10. An automatic wire feed system as set forth in claim 9 wherein said control means turns said gas control valve ON to supply gas under pressure to said air space when said drive motor is activated to supply fine wire to said wire feed slack loop means.

11. An automatic wire feed system as set forth in claim 10 which further includes wire clamp means coupled to said control means for closing said wire clamp on said fine wire when control means activates said drive motor.

12. An automatic wire feed system as set forth in claim 1 wherein said drive motor and said gas supply are turned OFF when said wire clamp is open.

13. An automatic wire feed system as set forth in claim 6 wherein said separator shim has a thickness equal to two to five times the diameter of said fine wire.

14. An automatic wire feed system set forth in claim 1 wherein said drive motor and said gas supply are turned OFF during a bonding operation.

15. The method of feeding a fine wire to a bonding tool:
providing fine wire on a wire spool through a wire feed slack loop apparatus to a bonding tool,
threading said fine wire in a narrow air space between a pair of closely spaced sector plates of said wire feed slack loop apparatus said sector plates being spaced apart by a separator shim,
applying gas under pressure to the narrow air space between said pair of sector plates and over said separator shim thus directing the gas radially outwardly creating a uniform pressure and force on said fine wire to form a substantially uniform radius slack wire loop to apply a uniform pressure and force on said fine wire radially outward therebetween and to form a substantially uniform radius slack wire loop,
activating a wire spool drive motor to feed fine wire to said sector plates of said slack loop apparatus, and
stopping said drive motor when said fine wire engages sensor means at the outer perimeter of said sector plates to provide said uniform radius slack wire loop.

16. The method of feeding a fine wire as set forth in claim 15 which further includes activating said gas and said drive motor only when there is no bonding operation being performed.

17. The method of feeding a fine wire as set forth in claim 16 which further includes closing a pair of wire clamps on said fine wire when activating said gas and said drive motor.

* * * * *